United States Patent
Yoon

(10) Patent No.: US 7,876,628 B2
(45) Date of Patent: *Jan. 25, 2011

(54) DATA OUTPUT CIRCUIT

(75) Inventor: Sang-Sic Yoon, Gyeonggi-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/502,374

(22) Filed: Jul. 14, 2009

(65) Prior Publication Data

US 2009/0273987 A1 Nov. 5, 2009

Related U.S. Application Data

(63) Continuation of application No. 11/592,205, filed on Nov. 3, 2006, now Pat. No. 7,580,300.

(30) Foreign Application Priority Data

Dec. 28, 2005 (KR) ............. 10-2005-0131713

(51) Int. Cl.
*G01C 7/00* (2006.01)
(52) U.S. Cl. ............... 365/189.17; 365/189.05; 365/201
(58) Field of Classification Search ........... 365/189.05, 365/189.17, 201
See application file for complete search history.

(56) References Cited

U.S. PATENT DOCUMENTS

| | | | |
|---|---|---|---|
| 6,378,008 B1 | 4/2002 | Gradinariu | |
| 6,763,473 B1 | 7/2004 | Oteki et al. | |
| 7,580,300 B2 * | 8/2009 | Yoon | 365/189.17 |
| 2005/0251359 A1 | 11/2005 | Cao et al. | |

FOREIGN PATENT DOCUMENTS

| | | |
|---|---|---|
| JP | 57199363 A | 12/1982 |
| JP | 58103262 A | 6/1983 |
| JP | 58184858 A | 10/1983 |
| JP | 05037975 A | 2/1993 |
| JP | 10232265 A | 9/1998 |
| KR | 1019940026960 | 12/1994 |
| KR | 101997007685 | 12/1997 |
| KR | 1020030001964 A | 1/2003 |

* cited by examiner

*Primary Examiner*—Hoai V Ho
(74) *Attorney, Agent, or Firm*—Venable LLP; Jeffri A. Kaminski

(57) ABSTRACT

A data output circuit of a semiconductor memory apparatus includes: a control unit that outputs a first standby instruction signal, a second standby instruction signal, a first output instruction signal, and a second output instruction signal in response to an input of a standby instruction signal, an output instruction signal, a first test signal, and a second test signal; a first output driver that causes first data to be output or to enter a standby state according to whether or not the first standby instruction signal or the first output instruction signal is enabled; and a second output driver that causes second data to be output or to enter a standby state according to whether or not the second standby instruction signal or the second output instruction signal is enabled.

4 Claims, 5 Drawing Sheets

DATA OUTPUT CIRCUIT

This application is a continuation of U.S. patent application No. 11/592,205, filed Nov. 3, 2006, now U.S. Pat. No. 7,580,300 the subject matter of which application is incorporated herein by reference in its entirety.

This U.S. non-provisional patent application claims priority under 35 U.S.C. §119 of Korean Patent Application No. 10-2005-0131713 filed on Dec. 28, 2005, the entire contents of which are hereby incorporated by reference.

BACKGROUND

1. Technical Field

The present invention relates to a data output circuit of a semiconductor memory apparatus, and in particular, to a data output circuit of a semiconductor memory apparatus by which the number of semiconductor memory chips testable by one piece of test equipment can be increased.

2. Related Art

In general, a semiconductor memory apparatus includes a plurality of data output pads through which data is output to the outside of a semiconductor memory chip. When the semiconductor memory apparatus is tested, the data is transmitted to test equipment through data output lines that are respectively connected to the plurality of data output pads. Here, depending on a test mode of the semiconductor memory apparatus, various kinds of test equipment may be used. At this time, the number of data output lines that can be connected to test equipment is limited. Accordingly, the number of semiconductor memory chips that each piece of test equipment can test at once is also limited, which is directly related to efficiency when the semiconductor memory apparatus is tested.

Hereinafter, a data output circuit according to the related art will be described with reference to FIG. 1.

FIG. 1 is a view illustrating an example in which a data output circuit of a semiconductor memory apparatus according to the related art is used.

In FIG. 1, even though first and second semiconductor memory chips 10 and 20 each have four output lines, an actual semiconductor memory chip is not limited thereto.

As shown in FIG. 1, each of the first and second semiconductor memory chips 10 and 20 has four data output pads, and data output from each of the data output pads is input to test equipment 50 through each of the data output lines 60. Assuming that only eight data output lines 60 can be connected to the test equipment 50, the test equipment 50 can test only two semiconductor memory chips at once. Accordingly, at least five tests should be performed in order to test ten semiconductor memory chips each having four data output lines.

As described above, in the related art, since only data from one output pad is output from each of the data output lines connected to the test equipment, the number of semiconductor memory chips that can be tested by one piece of test equipment is limited. As a result, the test efficiency is poor.

SUMMARY

Embodiments of the present invention provide a data output circuit of a semiconductor memory apparatus by which the number of semiconductor memory chips testable by one piece of test equipment can be increased by selectively outputting two data through one data output line, when data output of the semiconductor memory apparatus is tested, so as to decrease the number of data output lines.

According to an embodiment of the present invention, a data output circuit of a semiconductor memory apparatus includes: a control unit that outputs a first standby instruction signal, a second standby instruction signal, a first output instruction signal, and a second output instruction signal in response to an input of a standby instruction signal, an output instruction signal, a first test signal, and a second test signal; a first output driver that causes first data to be output or to enter a standby state according to whether or not the first standby instruction signal or the first output instruction signal is enabled; and a second output driver that causes second data to be output or to enter a standby state according to whether or not the second standby instruction signal or the second output instruction signal is enabled.

Furthermore, according to another embodiment of the present invention, a data output circuit of a semiconductor memory apparatus includes: a first output driver that causes first data to be output or to enter a standby state; a second output driver that causes the second data to be output or to enter a standby state; and a control unit that selectively activates the first and second output drivers.

DESCRIPTION OF EXEMPLARY EMBODIMENTS

Hereinafter, preferred embodiments of the present invention will be described in detail with reference to the accompanying drawings.

Figure 1:
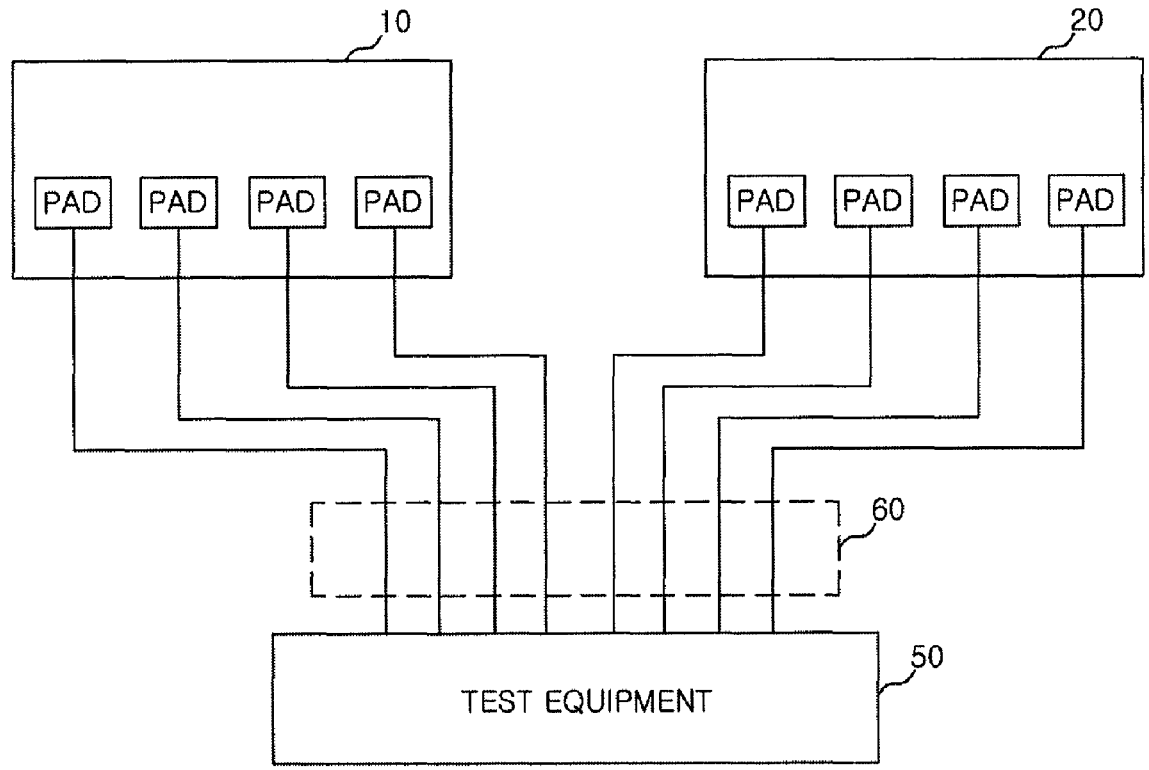
FIG. 1 illustrates a data output circuit of a semiconductor memory apparatus according to the related art.
Figure 2:
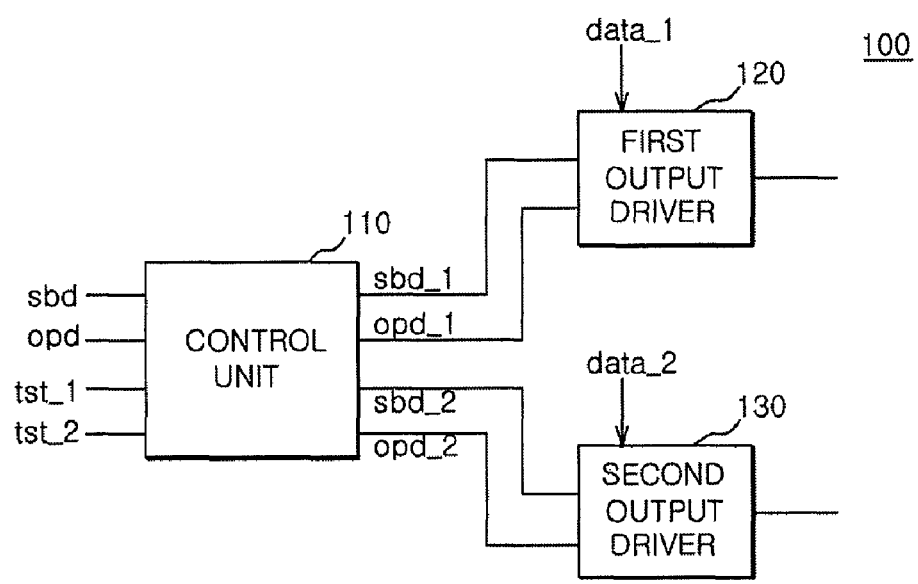
FIG. 2 is a block diagram illustrating the configuration of a data output circuit of a semiconductor memory apparatus according to an embodiment of the present invention.

FIG. 2 is a block diagram illustrating the configuration of a data output circuit of a semiconductor memory apparatus according to an embodiment of the present invention.

A data output circuit 100 shown in FIG. 2 includes a control unit 110 that outputs a first standby instruction signal sbd_1, a second standby instruction signal sbd_2, a first output instruction signal opd_1, and a second output instruction signal opd_2 in response to an input of a standby instruction signal sbd, an output instruction signal opd, a first test signal tst_1, and a second test signal tst_2; a first output driver 120 that causes first data data_1 to be output or to enter a standby state according to whether or not the first standby instruction signal sbd_1 or the first output instruction signal opd_1 is enabled; and a second output driver 130 that causes second data data_2 to be output or to enter a standby state according to whether or not the second standby instruction signal sbd_2 or the second output instruction signal opd_2 is enabled.

Here, the first test signal tst_1 is a signal that instructs whether the first standby instruction signal sbd_1 or the first output instruction signal opd_1, which is transmitted from the control unit 110 to the first output driver 120, is to be enabled or not. In addition, the second test signal tst_2 is a signal that instructs whether the second standby instruction signal sbd_2 or the second output instruction signal opd_2, which is transmitted from the control unit 110 to the second output driver 130, is to be enabled or not.

Furthermore, the first output instruction signal opd_1 is a signal that instructs an output operation of the first output driver 120 with respect to the first data data_1. In addition, the first standby instruction signal sbd_1 is a signal that, when the first output instruction signal opd_1 is disabled, causes the first output driver 120 not to affect data output from the second output driver 130.

Similarly, the second output instruction signal opd_2 is a signal that instructs an output operation of the second output driver 130 with respect to the second data data_2. In addition, the second standby instruction signal sbd_2 is a signal that, when the second output instruction signal opd_2 is disabled, causes the second output driver 130 not to affect data output from the first output driver 120.

When the output instruction signal opd and the first test signal tst_1 are enabled or the standby instruction signal sbd and the second test signal tst_2 are enabled, the control unit 110 causes the first output instruction signal opd_1 and the second standby instruction signal sbd_2 to be enabled and the second output instruction signal opd_2 and the first standby instruction signal sbd_1 to be disabled. Then, the first output driver 120 outputs the first data data_1 in response to an input of the first output instruction signal opd_1. On the other hand, the second output driver 130 controls an output signal in response to an input of the second standby instruction signal sbd_2 such that the first data data_1 is not affected.

Similarly, when the output instruction signal opd and the second test signal tst_2 are enabled or the standby instruction signal sbd and the first test signal tst_1 are enabled, the control unit 110 causes the second output instruction signal opd_2 and the first standby instruction signal sbd_1 to be enabled. Then, the second output driver 130 outputs the second data data_2 in response to an input of the second output instruction signal opd_2. On the other hand, the first output driver 120 controls an output signal in response to an input of the first standby instruction signal sbd_1 such that the second data data_2 is not affected.

When the test on the data output circuit 100 is completed, the output instruction signal opd, the standby instruction signal sbd, and the first and second test signals tst_1 and tst_2 are disabled. Accordingly, no data is output from the first and second output drivers 120 and 130.

Figure 3:
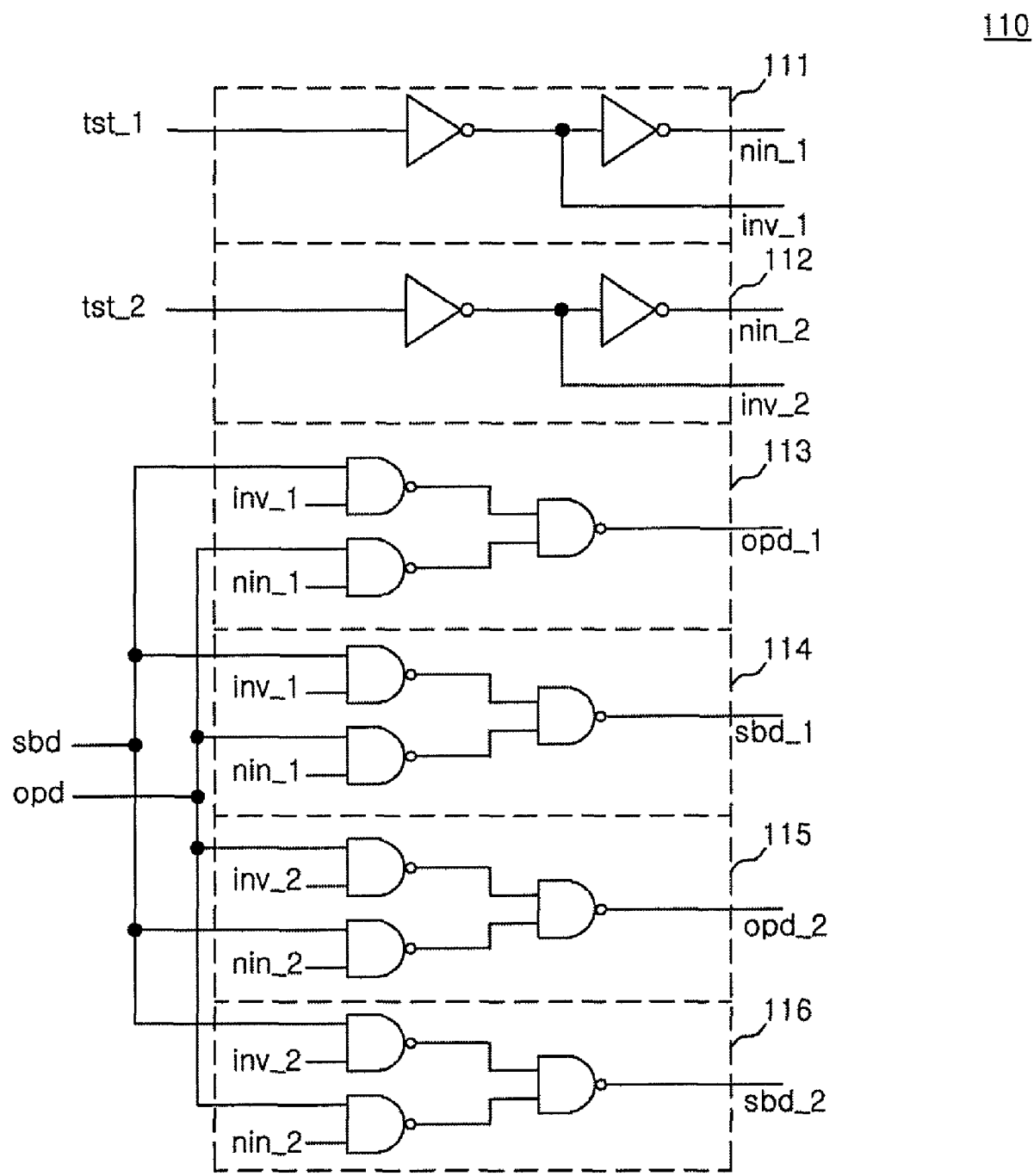
FIG. 3 is a detailed view illustrating the configuration of a control unit shown in FIG. 2.

FIG. 3 is a detailed view illustrating the configuration of the control unit 110 shown in FIG. 2.

The control unit 110 includes a first test signal input unit 111 that generates a first inverted signal inv_1 and a first non-inverted signal nin_1 in response to an input of the first test signal tst_1; a second test signal input unit 112 that generates a second inverted signal inv_2 and a second non-inverted signal nin_2 in response to an input of the second test signal tst_2; a first output instruction signal generation unit 113 that generates the first output instruction signal opd_1 in response to an input of the output instruction signal opd, the standby instruction signal sbd, the first inverted signal inv_1, and the first non-inverted signal nin_1; a first standby instruction signal generation unit 114 that generates the first standby instruction signal sbd_1 in response to the input of the output instruction signal opd, the standby instruction signal sbd, the first inverted signal inv_1, and the first non-inverted signal nin_1; a second output instruction signal generation unit 115 that generates the second output instruction signal opd_2 in response to an input of the output instruction signal opd, the standby instruction signal sbd, the second inverted signal inv_2, and the second non-inverted signal nin_2; and a second standby instruction signal generation unit 116 that generates the second standby instruction signal sbd_2 in response to the input of the output instruction signal opd, the standby instruction signal sbd, the second inverted signal inv_2, and the second non-inverted signal nin_2.

The first inverted signal inv_1 is a signal obtained by inverting the first test signal tst_1 with an inverter, and the first non-inverted signal nin_1 is a signal obtained by inverting the first inverted signal inv_1 with an inverter. As described above, the first inverted signal inv_1 and the first non-inverted signal nin_1 are input to the first output instruction signal generation unit 113 and the first standby instruction signal generation unit 114. Similarly, the second inverted signal inv_2 is a signal obtained by inverting the second test signal tst_2 with an inverter, and the second non-inverted signal nin_2 is a signal obtained by inverting the second inverted signal inv_2 with an inverter. The second inverted signal inv_2 and the second non-inverted signal nin_2 are input to the second output instruction signal generation unit 115 and the second standby instruction signal generation unit 116.

When the first non-inverted signal nin_1 and the second inverted signal inv_2 are enabled while the standby instruction signal sbd is enabled or when the first inverted signal inv_1 and the second non-inverted signal nin_2 are enabled while the output instruction signal opd is enabled, the first output instruction signal generation unit 113 and the second standby instruction signal generation unit 116 enable the first output instruction signal opd_1 and the second standby instruction signal sbd_2, respectively, and then output the enabled first output instruction signal opd_1 and the enabled second standby instruction signal sbd_2. At this time, the first standby instruction signal sbd_1 and the second output instruction signal opd_2 are disabled.

Furthermore, when the first non-inverted signal nin_1 and the second inverted signal inv_2 are enabled while the output instruction signal opd is enabled or when the first inverted signal inv_1 and the second non-inverted signal nin_2 are enabled while the standby instruction signal sbd is enabled, the first standby instruction signal generation unit 114 and the second output instruction signal generation unit 115 enable the first standby instruction signal sbd_1 and the second output instruction signal opd_2, respectively, and then output the enabled first standby instruction signal sbd_1 and the enabled second output instruction signal opd_2. At this time, the first output instruction signal opd_1 and the second standby instruction signal sbd_2 are disabled.

Figure 4:
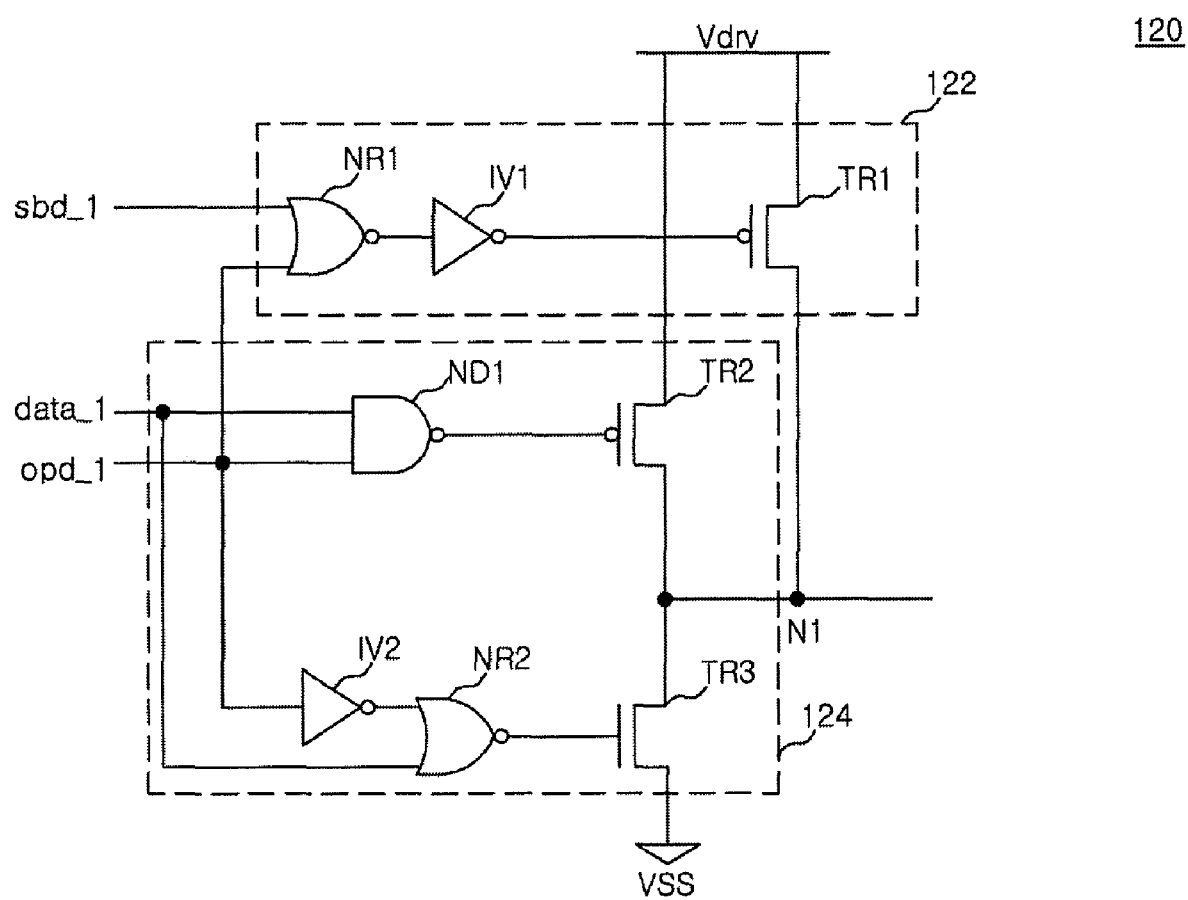
FIG. 4 is a detailed view illustrating the configuration of a first output driver shown in FIG. 2.

FIG. 4 is a detailed view illustrating the configuration of the first output driver 120 shown in FIG. 2.

The first output driver 120 includes a first switching unit 122 that supplies a driving voltage Vdrv to a first node N1 in response to an input of the first output instruction signal opd_1 and the first standby instruction signal sbd_1; and a second switching unit 124 that transmits the first data data_1 to the first node N1 in response to an input of the first output instruction signal opd_1 and the first data data_1.

Here, the first switching unit 122 includes a first NOR gate NR1 to which the first output instruction signal opd_1 and the first standby instruction signal sbd_1 are input; a first inverter IV1 to which an output signal of the first NOR gate NR1 is input; and a first transistor TR1 having a gate terminal to which the output signal of the first inverter IV1 is input, a source terminal to which the driving voltage Vdrv is applied, and a drain terminal connected to the first node N1.

In addition, the second switching unit 124 includes a first NAND gate ND1 to which the first output instruction signal opd_1 and the first data data_1 are input; a second transistor TR2 having a gate terminal to which an output signal of the first NAND gate ND1 is input, a source terminal to which the driving voltage Vdrv is applied, and a drain terminal connected to the first node N1; a second inverter IV2 to which the first output instruction signal opd_1 is input, a second NOR gate NR2 to which an output signal of the second inverter IV2 and the first data data_1 are input; and a third transistor TR3 having a gate terminal to which an output signal of the second NOR gate NR2 is input, a source terminal that is grounded, and a drain terminal connected to the first node N1.

In this case, the driving voltage Vdrv is a power supply voltage by which a voltage at the first node N1 has a high-level logic value. In addition, the driving voltage Vdrv can be obtained by means of an external power supply, for example, but is not limited thereto.

While the data output circuit 100 is tested, a signal output from the first inverter IV1 of the first switching unit 122 is always at a high level. Therefore, while the data output circuit 100 is tested, the first transistor TR1 is always turned off. Then, when the test is completed, the first transistor TR1 is turned on.

When the first output instruction signal opd_1 is enabled, assuming that the first data data_1 is at high level, the second transistor TR2 is turned on and the third transistor TR3 is turned off. As a result, the driving voltage Vdrv is supplied to the first node N1. However, in the case when the first data data_1 is at low level, the second transistor TR2 is turned off and the third transistor TR3 is turned on. As a result, a voltage level at the first node N1 becomes a ground voltage VSS level.

On the other hand, when the first output instruction signal opd_1 is disabled, both the second transistor TR2 and the third transistor TR3 are turned off. Accordingly, since the voltage level at the first node N1 becomes a floating voltage level, the data output from the second output driver 130 is not affected.

Figure 5:
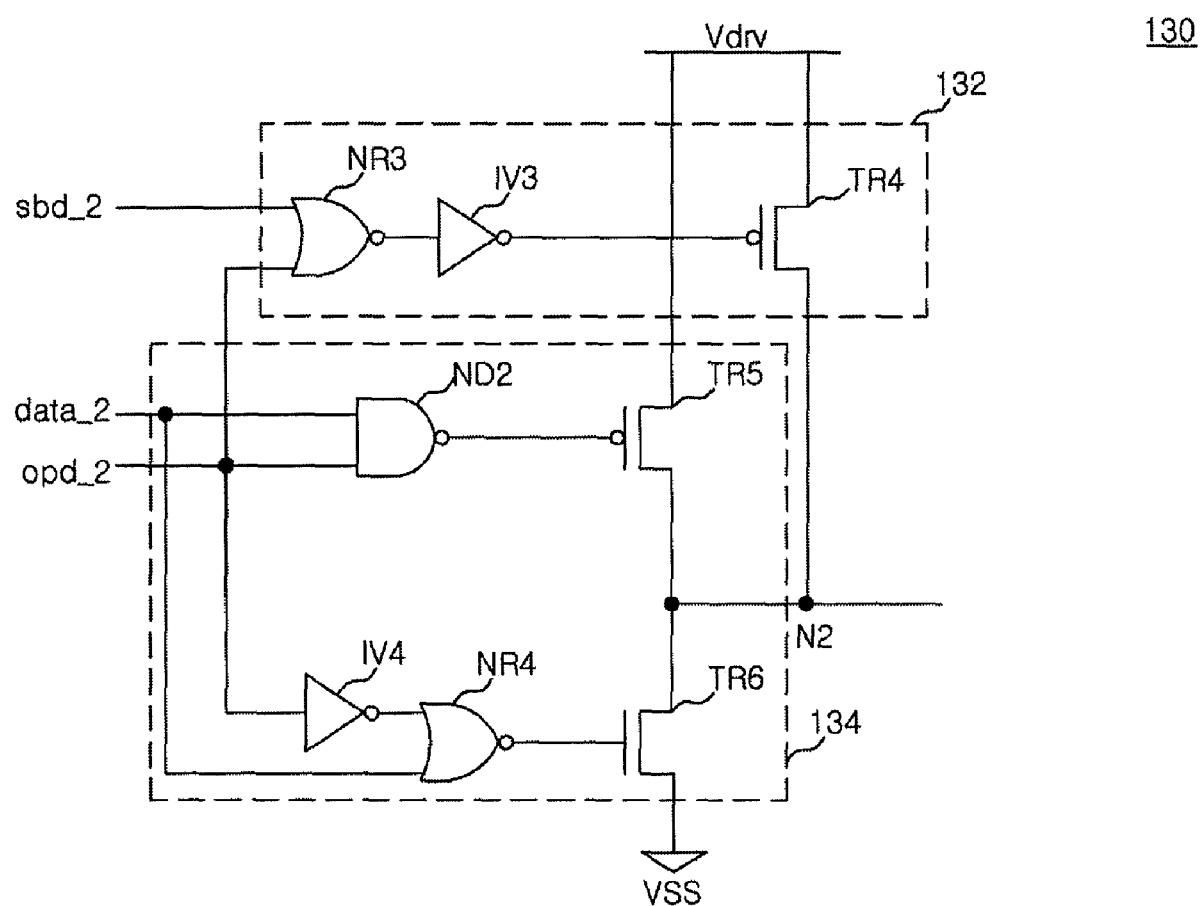
FIG. 5 is a detailed view illustrating the configuration of a second output driver shown in FIG. 2.

FIG. 5 is a detailed view illustrating the configuration of the second output driver 130 shown in FIG. 2.

The second output driver 130 includes a third switching unit 132 that supplies the driving voltage Vdrv to a second node N2 in response to an input of the second output instruction signal opd_2 and the second standby instruction signal sbd_2; and a fourth switching unit 134 that supplies the second data data_2 to the second node N2 in response to an input of the second output instruction signal opd_2 and the second data data_2.

Here, the third switching unit 132 includes a third NOR gate NR3 to which the second output instruction signal opd_2 and the second standby instruction signal sbd_2 are input; a third inverter IV3 to which an output signal of the third NOR gate NR3 is input; and a fourth transistor TR4 having a gate terminal to which an output signal of the third inverter IV3 is input, a source terminal to which the driving voltage Vdrv is applied, and a drain terminal connected to the second node N2.

In addition, the fourth switching unit 134 includes a second NAND gate ND2 to which the second output instruction signal opd_2 and the second data data_2 are input; a fifth transistor TR5 having a gate terminal to which an output signal of the second NAND gate ND2 is input, a source terminal to which the driving voltage Vdrv is applied, and a drain terminal connected to the second node N2; a fourth inverter IV4 to which the second output instruction signal opd_2 is input; a fourth NOR gate NR4 to which an output signal of the fourth inverter IV4 and the second data data_2 are input, and a sixth transistor TR6 having a gate terminal to which an output signal of the fourth NOR gate NR4 is input, a source terminal that is grounded, and a drain terminal connected to the second node N2.

In this case, the driving voltage Vdrv also is a power supply voltage by which a voltage at the second node N2 has a high-level logic value. In addition, the driving voltage Vdrv can be obtained by means of the external power supply, for example, but is not limited thereto.

While the data output circuit 100 is tested, a signal output from the third inverter IV3 of the third switching unit 132 is always at a high level. Therefore, while the data output circuit 100 is tested, the fourth transistor TR4 is always turned off. Then, when the test is completed, the fourth transistor TR4 is turned on.

When the second output instruction signal opd_2 is enabled, assuming that the second data data_2 is at high level, the fifth transistor TR5 is turned on and the sixth transistor TR6 is turned off. As a result, the driving voltage Vdrv is supplied to the second node N2. However, in the case when the second data data_2 is at low level, the fifth transistor TR5 is turned off and the sixth transistor TR6 is turned on. As a result, a voltage level at the second node N2 becomes the ground voltage VSS level.

On the other hand, when the second output instruction signal opd_2 is disabled, both the fifth transistor TR5 and the sixth transistor TR6 are turned off. Accordingly, since the voltage level at the second node N2 becomes a floating voltage level, the data output from the first output driver 120 is not affected.

Figure 6:
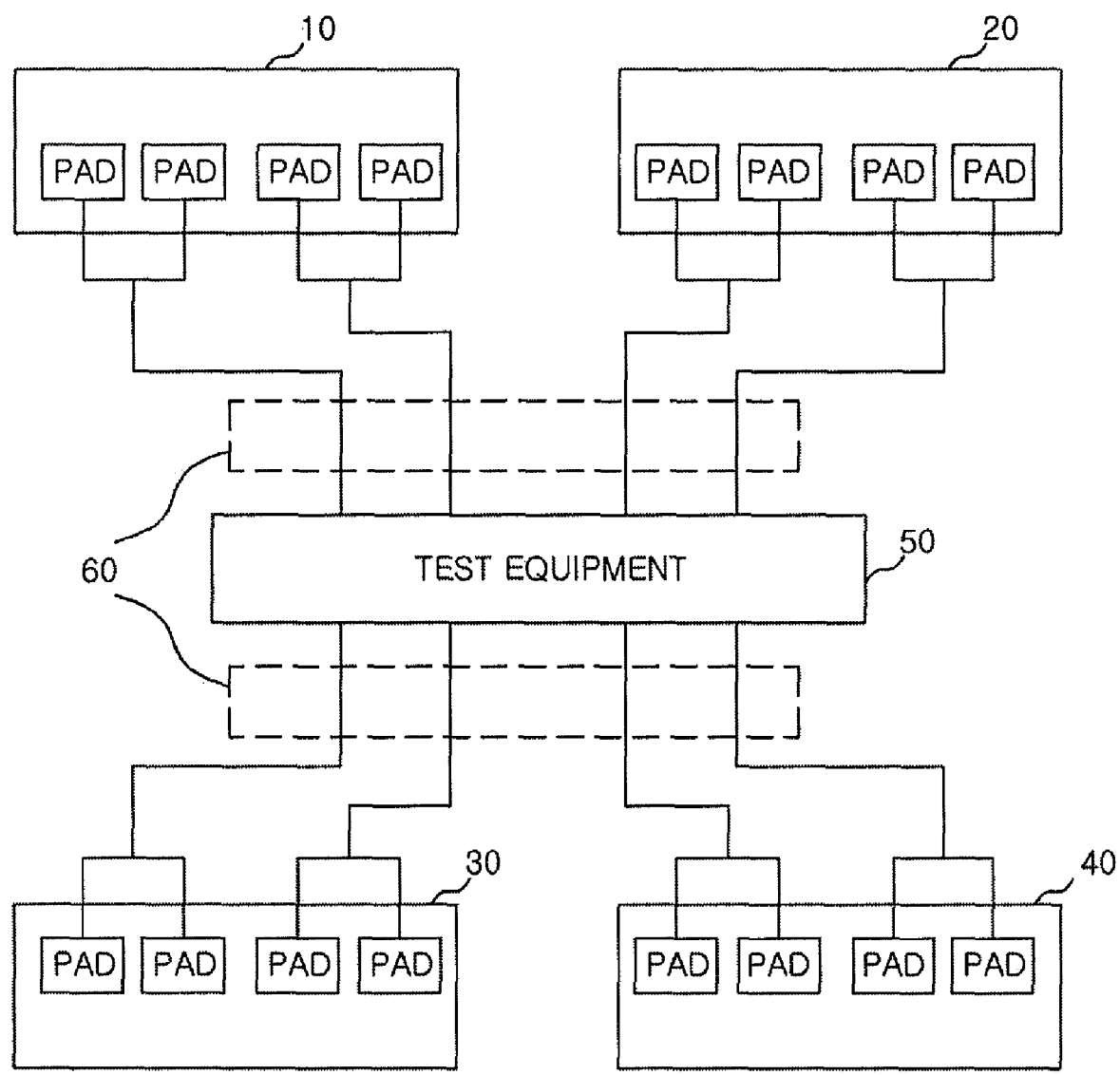
FIG. 6 is a view illustrating an example in which the data output circuit of the semiconductor memory apparatus according to an embodiment of the present invention is used.

FIG. 6 is a view illustrating an example in which a data output circuit of a semiconductor memory apparatus is used.

In FIG. 6, an example is shown in which a first semiconductor memory chip 10, a second semiconductor memory chip 20, a third semiconductor memory chip 30, and a fourth semiconductor memory chip 40 each have two output lines. However, the semiconductor memory chip of the present invention is not limited to the example shown in FIG. 6.

As shown in FIG. 6, each of the first, second, third, and fourth semiconductor memory chips 10, 20, 30, and 40 has four data output pads. Data output from two of the data output pads is input to the test equipment 50 through one data output line. Assuming that only eight data output lines 60 can be connected to the test equipment 50, the test equipment 50 can test four semiconductor memory chips at once. Assuming that the test equipment 50 is used in the related art, only two of the semiconductor memory chips could be tested at once. However, in the data output circuit 100 according to the embodiment of the present invention, since data from two output pads are output through one data output line, the number of data output lines can be reduced. As a result, it is possible to increase the number of semiconductor memory chips that can be tested by one piece of test equipment.

As described above, in the case in which the data output circuit of the described semiconductor memory apparatus according to the embodiment of the present invention is used, two data can be selectively output through one data output line when a data output of the semiconductor memory apparatus is tested. As a result, the number of data output lines can be reduced, which increases the number of semiconductor memory chips that can be tested by one piece of test equipment.

Although the present invention has been described in connection with the exemplary embodiments of the present invention, it will be apparent to those skilled in the art that various modifications and changes may be made thereto without departing from the scope and spirit of the present invention. Therefore, it should be understood that the above embodiments are not limitative but illustrative in all aspects.

In addition, the scope of the present invention is defined by the appended claims rather than by the above exemplary embodiments, and all changes that fall within the metes and bounds of the claims, or the equivalents of such metes and bounds are therefore intended to be embraced by the claims.

What is claimed is:

1. An integrated circuit, comprising:
   a semiconductor chip including at least two output pads; and
   a data output circuit configured to receive first and second data of first and second output pads of the at least two output pads, and to provide a selected one of the first and second data to a terminal of a test equipment using test signals, wherein the data output circuit includes:
   a control unit configured to receive an output instruction signal, a standby instruction signal and a plurality of test mode signals, generate a first output instruction signal and a first standby instruction signal for selecting the first data, and generate a second output instruction signal and a second standby instruction signal for selecting the second data;
   a first output driver configured to output the first data and enter a standby state in response to the first output instruction signal and the first standby instruction signal; and
   a second output driver to output the second data and enter the standby state in response to the second output instruction signal and the second standby instruction signal.

2. The integrated circuit of claim 1,
   wherein the control unit includes:
   a first test signal input unit configured to generate a first inverted signal and a first non-inverted signal in response to a first test signal;
   a second test signal input unit configured to generate a second inverted signal and a second non-inverted signal in response to a second test signal;
   a first output instruction signal generation unit configured to generate the first output instruction signal in response to the output instruction signal, the standby instruction signal, the first inverted signal, and the first non-inverted signal;
   a first standby instruction signal generation unit configured to generate the first standby instruction signal in response to the output instruction signal, the standby instruction signal, the first inverted signal, and the first non-inverted signal;
   a second output instruction signal generation unit configured to generate the second output instruction signal in response to the output instruction signal, the standby instruction signal, the second inverted signal, and the second non-inverted signal; and
   a second standby instruction signal generation unit configured to generate the second standby instruction signal in response to the output instruction signal, the standby instruction signal, the second inverted signal, and the second non-inverted signal.

3. The integrated circuit of claim 1,
   wherein the first output driver includes:
   a first node;
   a first switching unit configured to supply an external power supply voltage to the first node or to block the external power supply voltage from being supplied to the first node in response to the first output instruction signal and the first standby instruction signal; and
   a second switching unit configured to transmit the first data to the first node or to block the first data from being transmitted to the first node according to whether or not the first output instruction signal is enabled.

4. The integrated circuit of claim 1,
   wherein the second output driver includes:
   a first node;
   a first switching unit configured to supply an external power supply voltage to the first node or blocks the external power supply voltage from being supplied to the first node in response to the second output instruction signal and the second standby instruction signal; and
   a second switching unit configured to transmit the second data to the first node or to block the second data from being transmitted to the first node according to whether or not the second output instruction signal is enabled.

* * * * *